(12) United States Patent　　(10) Patent No.: US 7,646,450 B2
Jung　　(45) Date of Patent: Jan. 12, 2010

(54) LIGHT EMITTING DIODE ARRAY, METHOD OF MANUFACTURING THE SAME, BACKLIGHT ASSEMBLY HAVING THE SAME, AND LCD HAVING THE SAME

(75) Inventor: Sung Min Jung, Inchon-si (KR)

(73) Assignee: LG Display Co., Ltd., Seoul (KR)

( * ) Notice: Subject to any disclaimer, the term of this patent is extended or adjusted under 35 U.S.C. 154(b) by 455 days.

(21) Appl. No.: 11/398,561

(22) Filed: Apr. 6, 2006

(65) Prior Publication Data

US 2007/0153159 A1　　Jul. 5, 2007

(30) Foreign Application Priority Data

Dec. 29, 2005　(KR) ..................... 10-2005-0133678

(51) Int. Cl.
*G02F 1/1335*　　(2006.01)
*G02F 1/1333*　　(2006.01)

(52) U.S. Cl. ............................. 349/69; 349/58; 349/65

(58) Field of Classification Search ................... 349/58, 349/65, 69
See application file for complete search history.

(56) References Cited

U.S. PATENT DOCUMENTS

| | | | |
|---|---|---|---|
| 2002/0149943 A1* | 10/2002 | Obata | 362/339 |
| 2005/0007516 A1* | 1/2005 | Hong et al. | 349/64 |
| 2005/0088586 A1* | 4/2005 | Mori et al. | 349/62 |
| 2006/0187372 A1* | 8/2006 | Kim et al. | 349/58 |

FOREIGN PATENT DOCUMENTS

JP　　09092886 A　*　4/1997

* cited by examiner

*Primary Examiner*—David Nelms
*Assistant Examiner*—David Y Chung
(74) *Attorney, Agent, or Firm*—Birch, Stewart, Kolasch & Birch, LLP (57) ABSTRACT

Provided is a light emitting diode array including: a plurality of light emitting chips spaced apart from one another by a predetermined distance; and a fixing member that positions the plurality of light emitting chips at predetermined heights and/or predetermined directions. Also provided are methods for manufacturing the light emitting diode array, a backlight assembly including the light emitting diode array, and a liquid crystal display device including the light emitting diode array.

42 Claims, 7 Drawing Sheets

LIGHT EMITTING DIODE ARRAY, METHOD OF MANUFACTURING THE SAME, BACKLIGHT ASSEMBLY HAVING THE SAME, AND LCD HAVING THE SAME

BACKGROUND OF THE INVENTION

The present invention claims the benefit of Korean Patent Application No. 10-2005-0133678, filed in Korea on Dec. 29, 2005, which is hereby incorporated by reference.

FIELD OF THE INVENTION

The present invention relates to a light emitting diode array with improved brightness uniformity, a method of fabricating the same, a backlight assembly having the same, and a liquid crystal display device (LCD) having the same.

DESCRIPTION OF THE RELATED ART

Cathode ray tubes (CRTs) have been widely used as monitors for televisions, measuring instruments, information terminals, and the like. However, since the CRT is bulky and heavy, it is inadequate for implementing a miniaturized and lightweight electronic product.

To replace the CRT, a LCD using an electric field and optical effect, a plasma display panel (PDP) using a gas discharge, and an electro luminescence display (ELD) using a field emission effect have been developed. Among them, the LCD is actively researched.

Meanwhile, since most of the LCDs are light receiving devices that display an image by controlling the amount of light incident from the outside, a backlight assembly is required to irradiate light onto a liquid crystal panel.

The backlight assembly has been used to read information displayed on a screen of the LCD in a dark place. Recently, a light guide plate has been formed more thinly so as to meet the requirements of design, low power consumption, and slim profile.

The backlight assemblies are classified into edge type backlight assemblies and direct type backlight assemblies according to the arrangement of the light source. In the case of the edge type backlight assembly, a light source is disposed at the side of the liquid crystal panel and a light guide plate is disposed at the rear of the liquid crystal panel to guide light from the side to the front of the liquid crystal panel. In the case of the direct type backlight assembly, a plurality of light sources are provided at the rear of the liquid crystal panel, and the light emitted from the plurality of light sources is directly irradiated onto the liquid crystal panel disposed at the front of the light sources.

Recently, light emitting diodes (LEDs) that can implement various colors have been used to improve display quality.

The LED is a solid device that uses the photoelectric transformation effect of a semiconductor. The LED emits light when a forward voltage is applied thereto. Compared with a fluorescent lamp using a tungsten filament, the LED emits light at a low voltage. The LED emits light by the energy difference occurring when an electron and a hole are recombined, not by the heated filament. Thus, the LED has been widely used in various kinds of display devices.

Since the LED can emit light at a DC voltage of several volts, a DC-AC converter is not required. Therefore, the construction of a driving device is simple. Also, since the LED is a semiconductor device, it has high reliability and a long lifespan. Also, the LED is advantageous to miniaturization of the device.

Figure 1A:
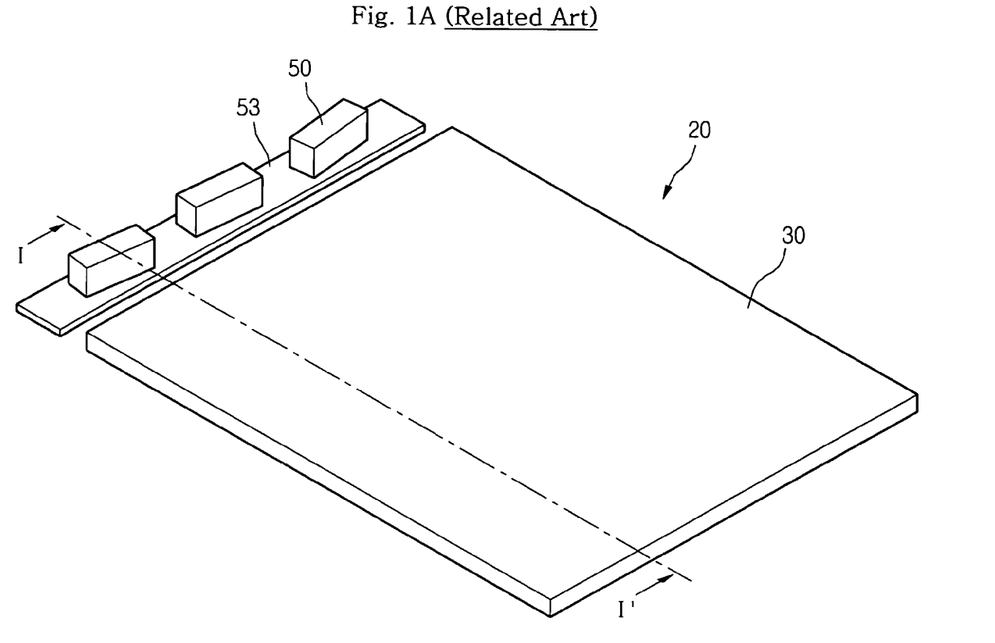
FIG. 1A is an exploded perspective view of an edge type backlight assembly in a related art LCD.

FIG. 1A is an exploded perspective view of an edge type backlight assembly in a related art LCD.

Referring to FIG. 1A, the edge type backlight assembly 20 according to the related art includes a plurality of LEDs 50 arranged at the side and spaced apart from one another by a predetermined distance to emit light, a printed circuit board (PCB) 53 for supplying an electric signal to the LEDs 50, and a light guide plate 30 for converting light emitted from the LEDs 50 into surface light. Although not shown, the edge type backlight assembly 20 further includes optical sheets disposed on the light guide plate 30 to diffuse and condense the light, and a reflection plate disposed on a rear surface of the light guide plate 30 to reflect the light irradiated thereon from the light guide plate 30.

The plurality of LEDs 50 serve as a point light source and may be provided with one or a combination of a red LED, a green LED, a blue LED, and a white LED. The plurality of LEDs 50 are individually mounted on the PCB 53.

The LEDs 50 may be mounted on the PCB 53 by wire bonding or flip chip bonding.

The LEDs 50 must be correctly aligned such that they are arranged on the same plane as the light guide plate 30. In the process of mounting the LEDs 50, however, the LEDs 50 may not be correctly aligned on the same plane as the light guide plate 30 due to an equipment malfunction or a mistake of the operator. In addition, the aligned positions of the LEDs 50 may be moved by heat that is generated when the mounted LEDs 50 are driven.

Figure 1B:
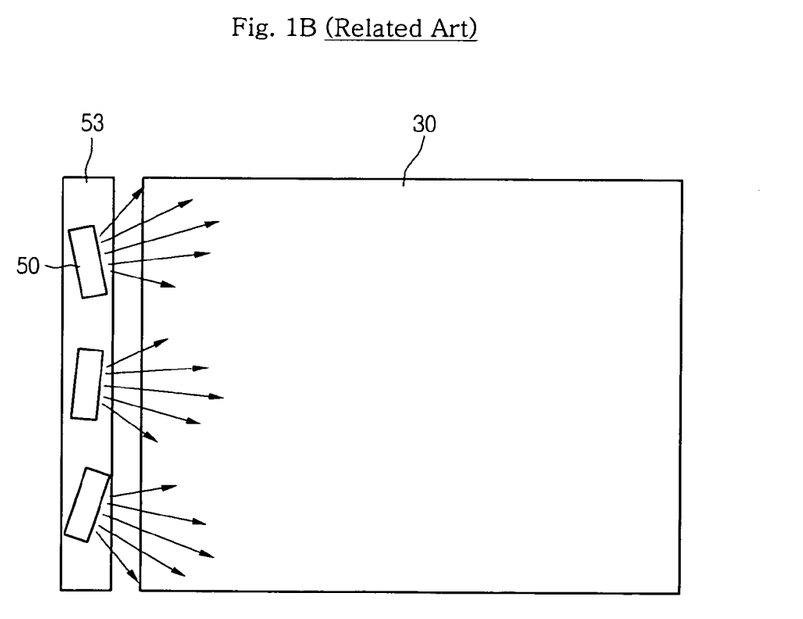
FIGS. 1B and 1C are a top plan view and a sectional view of a defective edge type backlight assembly, respectively.
Figure 1C:
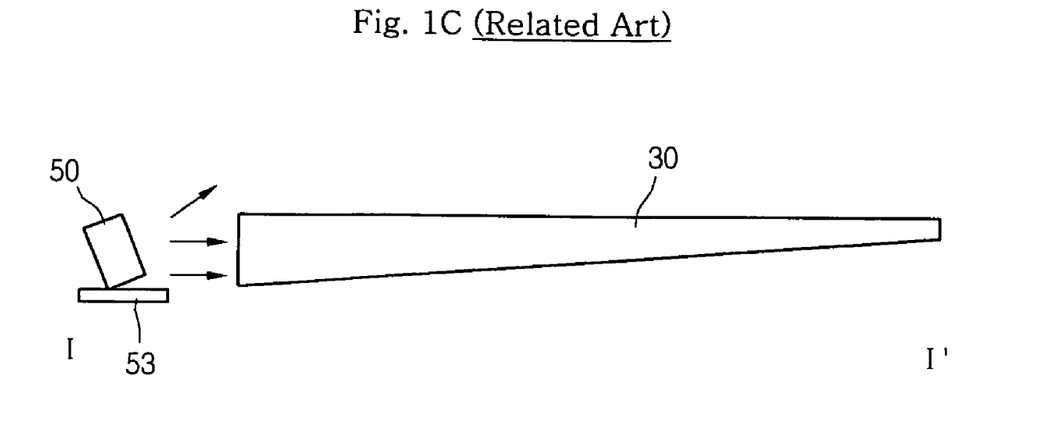

FIGS. 1B and 1C are a top plan view and a sectional view of a defective edge type backlight assembly, respectively.

Referring to FIGS. 1B and 1C, the light emission direction of the LEDs in the edge type backlight assembly 20 is horizontal. However, as the LEDs 50 are mounted on the PCB 53, horizontal or vertical tilt/twist may occur during the assembling process. That is, when the LEDs 50 are misaligned, even slightly, during the assembling process, the path of light incident from the side to the light guide plate 30 is changed, causing non-uniform brightness. In addition, the optical efficiency is degraded because all of the light is not incident into the light guide plate 30, resulting in light leakage.

SUMMARY OF THE INVENTION

The present invention is directed to a light-emitting diode array, a method of fabricating the same, a backlight assembly having the same, and a LCD having the same that substantially obviate one or more problems due to the limitations and disadvantages of the related art.

An object of the present invention is to provide a light-emitting diode array, a method of fabricating the same, a backlight assembly having the same, and a LCD having the same, in which a plurality of light emitting chips are mounted on a single package, thereby preventing non-uniform brightness.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a light emitting diode array including: a plurality of light emitting chips spaced apart from one another by predetermined distances; and at least one fixing member enclosing the plurality of light emitting chips, wherein said at least one fixing member positions the light emitting chips at predetermined heights and/or predetermined directions.

In another aspect of the present invention, there is provided a method of fabricating a light emitting diode array, including: providing a plurality of light emitting chips, wherein each light emitting chip preferably includes an insulation board, a lead frame formed on the insulation board, and a light emitting diode mounted on the lead frame; and forming at least one fixing member enclosing the insulation boards, wherein the insulation boards are fixed at predetermined intervals.

In another aspect of the present invention, there is provided a method of fabricating a light emitting diode array, including: forming at least one mold having cavities formed therein at predetermined intervals; and inserting a light emitting chip into each cavity, wherein each light emitting chip preferably includes an insulation board, a lead frame formed on the insulation board, and a light emitting diode mounted on the lead frame.

In a further aspect of the present invention, there is provided a backlight assembly including: a light emitting diode array having a plurality of light emitting chips spaced apart from one another by a predetermined distance, and at least one fixing member enclosing the plurality of light emitting chips, wherein the at least one fixing member positions the light emitting chips at predetermined heights and/or predetermined directions; and a circuit board that applies an electric signal to the light emitting diode array.

In a further aspect of the present invention, there is provided a backlight assembly including: a plurality of light emitting diode arrays each having a plurality of light emitting chips spaced apart from one another by a predetermined distance, and at least one fixing member enclosing the plurality of light emitting chips, wherein the at least one fixing member positions the light emitting chips at predetermined heights and/or predetermined directions; and a plurality of circuit boards respectively mounted on the light emitting diode arrays that apply electric signals to the light emitting diode arrays.

In a further aspect of the present invention, there is provided a liquid crystal display device including: a light emitting diode array having a plurality of light emitting chips spaced apart from one another by a predetermined distance, and at least one fixing member enclosing the plurality of light emitting chips, wherein the at least one fixing member positions the light emitting chips at predetermined heights and/or predetermined directions; a circuit board to apply an electric signal to the light emitting diode array; a light guide plate to receive light from the light emitting diode array and generate surface light; and a liquid crystal panel disposed above the light guide plate.

In a further aspect of the present invention, there is provided a liquid crystal display device including: a plurality of light emitting diode arrays each having a plurality of light emitting chips spaced apart from one another by a predetermined distance, and at least one fixing member enclosing the plurality of light emitting chips, wherein the at least one fixing member positions the light emitting chips at predetermined heights and/or predetermined directions; a plurality of circuit boards respectively mounted on the light emitting diode arrays that apply electric signals to the light emitting diode arrays; a light diffuser disposed above the light emitting diode arrays; and a liquid crystal panel disposed above the light diffuser.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 2A:
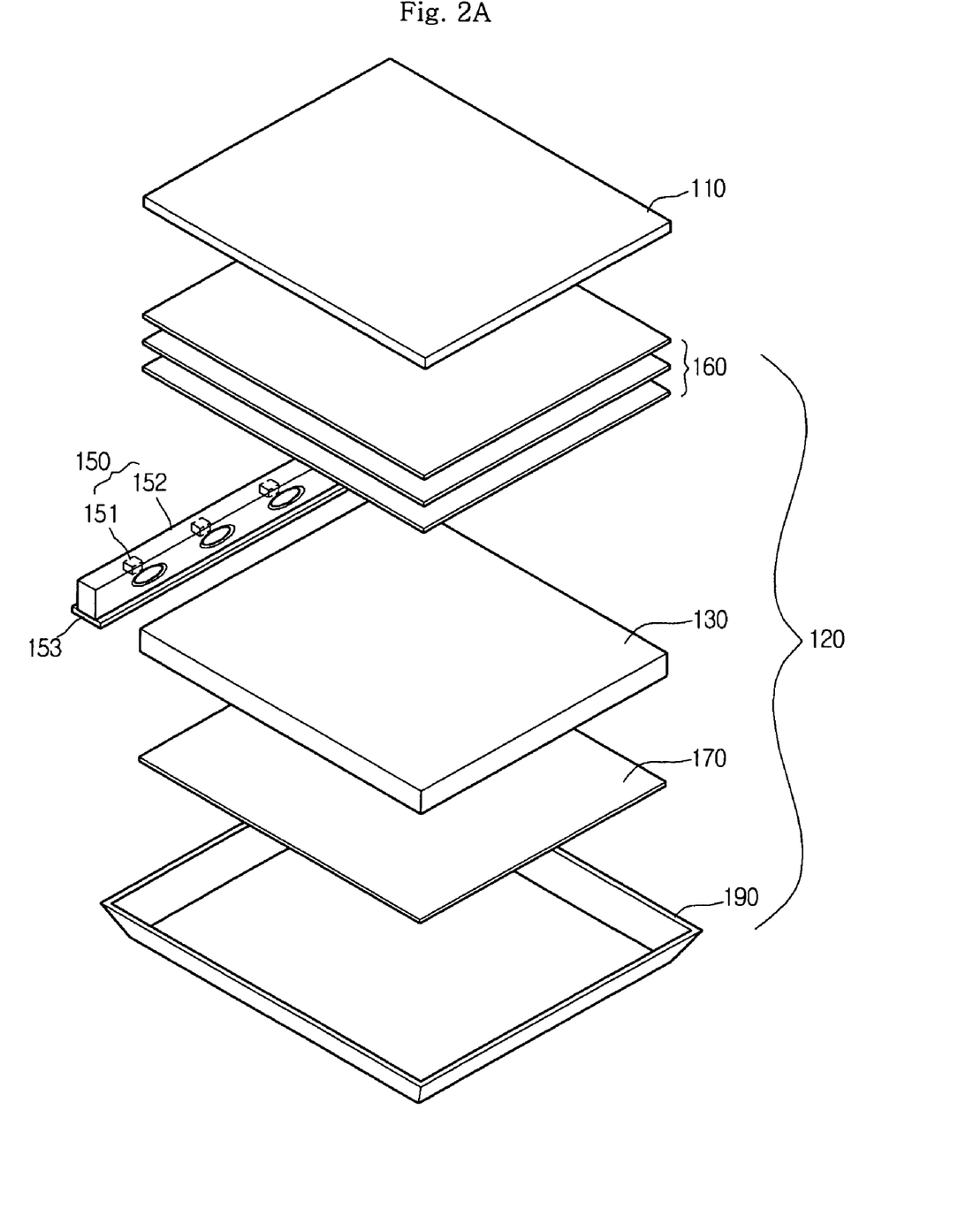
FIG. 2A is an exploded perspective view of an edge type LCD according to an embodiment of the present invention.

FIG. 2A is an exploded perspective view of an edge type LCD according to an embodiment of the present invention.

Referring to FIG. 2A, the edge type LCD of the present invention includes a liquid crystal panel 110 for displaying an image and a backlight assembly 120 for supplying light to the liquid crystal panel 110.

The backlight assembly 120 includes an LED array 150 disposed at a side thereof, a printed circuit board (PCB) 153 having a conductive pattern to supply an electric signal to the LED array 150, a light guide plate 130 for converting light emitted from the LED array 150 into surface light, optical sheets 160 disposed on the light guide plate 130 to diffuse and condense the light, a reflection plate 170 disposed on a rear surface of the light guide plate 130 to reflect the light irradiated from the light guide plate 130, and a bottom case 190 for supporting the LED array 150, the PCB 153, the light guide plate 130, and the reflection plate 170.

The backlight assembly 120 may further include a heat sink (not shown) attached to a rear surface of the PCB 153 to dissipate heat from the LED array 150.

Instead of the PCB 153, a flexible printed circuit board (FPC) may be provided to apply an electric signal to the LED array 150.

In addition, the PCB 153 or the FPC can also serve as the heat sink (not shown) for dissipating heat generated while the LED array 150 is driven. Therefore, the PCB 153 or the FPC may include a conductive pattern through which an electric signal is inputted/outputted. The conductive pattern may be formed of materials (e.g., aluminum (Al)) that have high heat conductivity. The PCB 153 or the FPC is of a size that may be determined by the number of the LED arrays 150 mounted thereon.

The LED array 150 includes a plurality of light emitting chips 151 and a phosphor (not shown). Also, the LED array 150 includes a mold 152 that encloses the light emitting chips 151 and the phosphor to thereby protect and support the light emitting chips 151.

The optical efficiency can be improved by forming a reflective layer on a region of the mold where the light emitting chips are formed.

The plurality of light emitting chips 151 may be provided with combinations of red, green, blue, and white light emitting chips 151. Therefore, red, green, blue, and white light can be implemented by mounting at least one of the red, green, blue, and white LEDs on the light emitting chip 151. Specifically, the white light can be obtained by the combination of the red, green, and white LEDs. Alternatively, the white light can be obtained by molding the phosphor on the blue LED.

Unlike the related art in which the mold is formed at every light emitting chip, according to one aspect of the present invention the plurality of light emitting chips are preferably packaged in a mold, most preferably a single mold. In this manner, since all of the light emitting chips are packaged in the single mold, all light emission directions can be equal.

Although not show, the LED array 150 may be mounted on the PCB 153 or the FPC by wire bonding or flip chip bonding. In the LED array 150, the plurality of light emitting chips 151 are integrally formed in the single mold 152 and fixed to have a predetermined height and/or a predetermined direction. Preferably, the plurality of light emitting chips are fixed to have the substantially same height and/or substantially the same direction, most preferably the same height and the same direction. Therefore, misalignment can be prevented in the process of aligning the light emitting chips on the PCB 153 or the FPC.

Since the LED array 150 can be correctly aligned on the PCB 153 or the FPC, the brightness uniformity is improved and light leakage is prevented, thereby improving the optical efficiency.

Figure 2B:
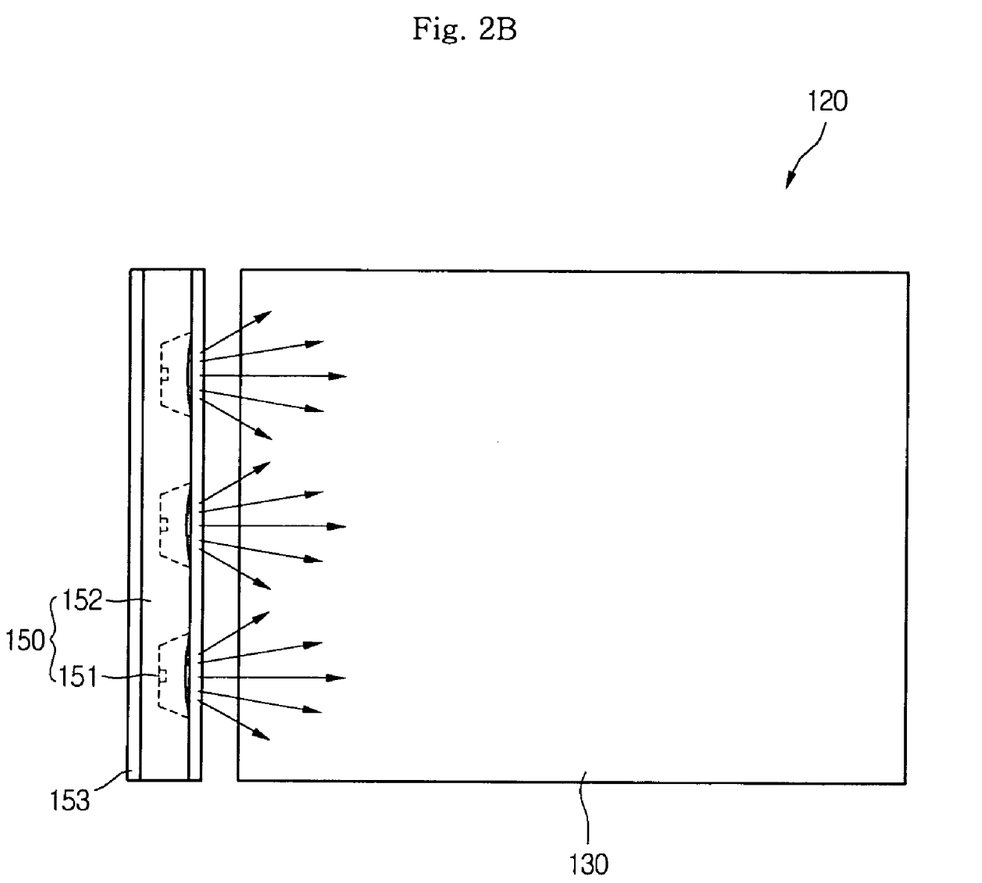
FIG. 2B is a top plan view illustrating a light emission path of the backlight assembly according to an embodiment of the present invention.

FIG. 2B is a top plan view illustrating a light emission path of the backlight assembly according to an embodiment of the present invention.

Referring to FIG. 2B, the LED array 150 includes a plurality of light emitting chips 151 that are integrally formed in a single mold 152, thereby preventing non-uniform brightness due to the misalignment that may be caused by the arrangement of the plurality of LED arrays 150. A printed circuit board (PCB) 153 or a FPC supplies an electric signal to the LED array 150.

The plurality of light emitting chips 151 in the LED array 150 may be fixed in the same direction by the mold 152 and arranged on the same plane as that of the light guide plate 130. In this case, the light emitting chips are arranged such that the light is directed toward the light guide plate 130.

In one embodiment, since the paths (→) of the light emitted from the LED array 150 are uniform with respect to an incident surface of the light guide plate 130, non-uniform brightness can be prevented, thus improving the optical efficiency. In addition, since the LED array 150 is correctly aligned, light leakage can be prevented.

Figure 3:
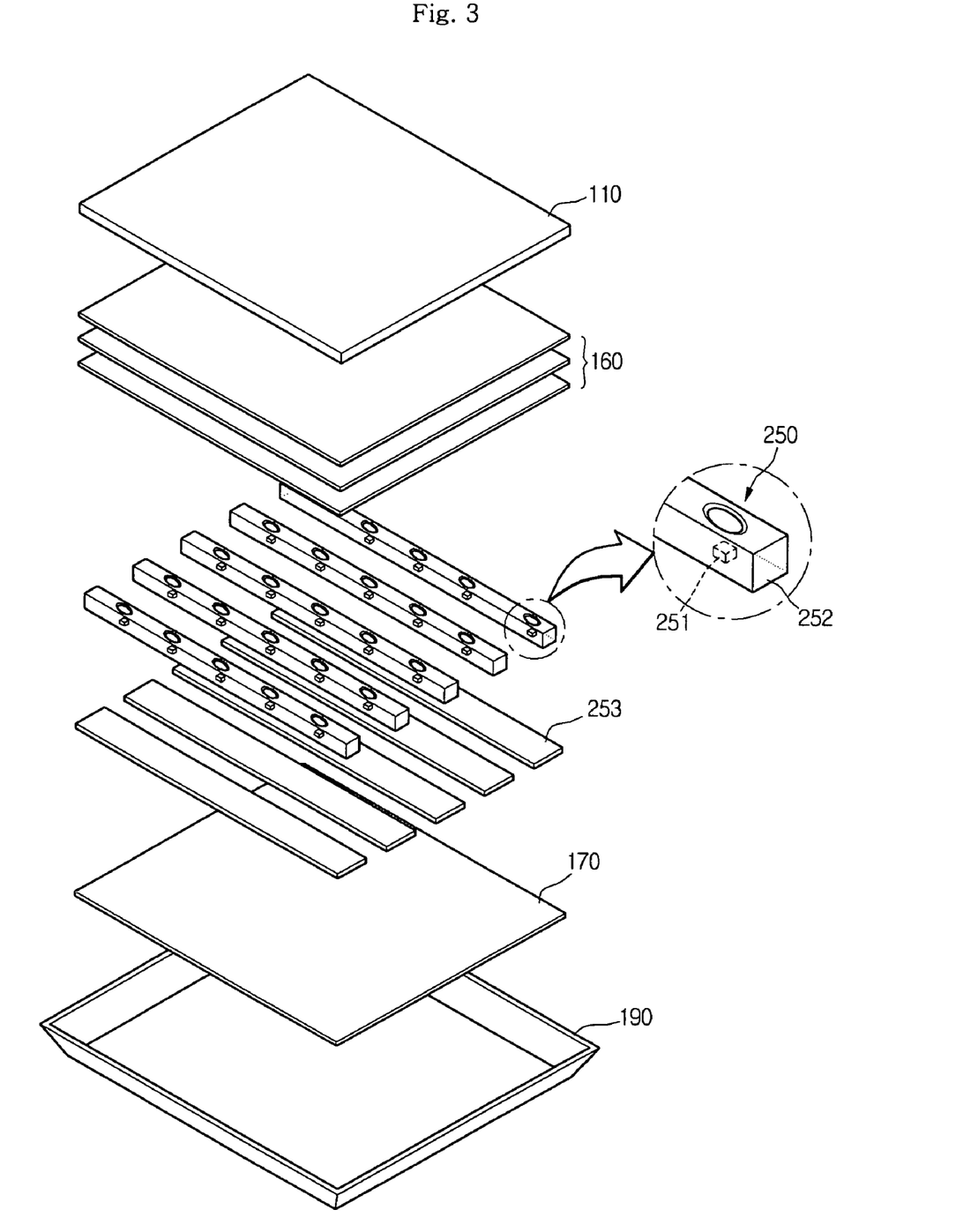
FIG. 3 is an exploded perspective view of a direct type LCD according to another embodiment of the present invention.

FIG. 3 is an exploded perspective view of a direct type LCD according to another embodiment of the present invention.

The direct type LCD of FIG. 3 has the same structure as that of the edge type LCD of FIG. 2A, except for the LED array 250. A detailed description of the same elements will be omitted.

In the direct type LCD illustrated in FIG. 3, a plurality of LED arrays 250 are arranged on a bottom case 190 (with a reflection plate 170 disposed therebetween) and spaced apart from one another by a predetermined distance.

The LED arrays 250 are formed in a single package, such that a single mold 252 encloses a plurality of light emitting chips 251. Therefore, the respective light emitting chips 251 are fixed to the mold 252 in the same direction.

A PCB 253 or a FPC is disposed on a rear surface of the LED arrays 250 to apply an electric signal thereto. The LED array 250 may be mounted on the PCB 253 or the FPC by wire bonding or flip chip bonding.

The plurality of light emitting chips 251 may be provided with combinations of red, green, blue, and white light emitting chips 251.

In the LED array, the plurality of light emitting chips 251 are fixed to the single mold 252 in substantially the same direction. Therefore, the light emitting chips 251 can directly irradiate uniform light on the liquid crystal panel 110.

In addition, the LED arrays 250 are aligned on the PCB 253 or the FPC that is disposed under the liquid crystal panel 110, thereby providing the stabilized brightness and the increased optical efficiency.

FIGS. 4A to 4D are sectional views illustrating one method of fabricating the LED array according to an embodiment of the present invention.

Figure 4A:
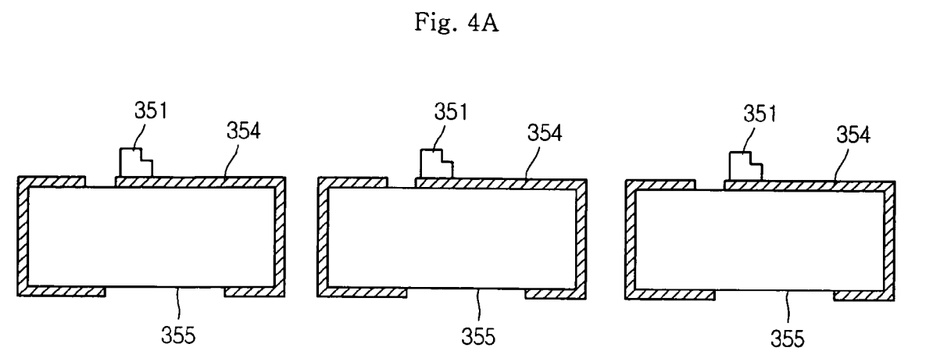
FIGS. 4A to 4D are sectional views illustrating a method of fabricating an LED array according to an embodiment of the present invention.

Referring to FIG. 4A, a plurality of light emitting chips 351 are mounted on lead frames 354 by die bonding. At this point, the lead frames 354 are formed such that they enclose a plurality of insulation boards 355.

The insulation board 355 is may be formed of polymer material or ceramic. The die bonding is one of semiconductor component assembly technologies. Generally, thermocompression bonding or ultrasonic bonding is used.

Figure 4B:
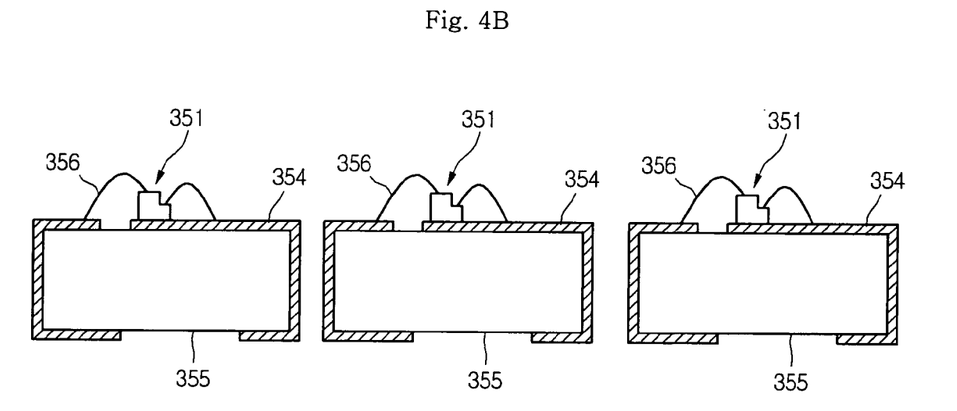

Referring to FIG. 4B, after the plurality of light emitting chips 351 are mounted on the lead frames 354, P- and N-electrodes are electrically contacted with the lead frames 354 by bonding wires 356.

Although the wire bonding is illustrated in the drawings, a flip chip bonding can also be used for an LED in which an active layer is formed on a substrate (e.g., a sapphire substrate) having high transmittance.

Figure 4C:
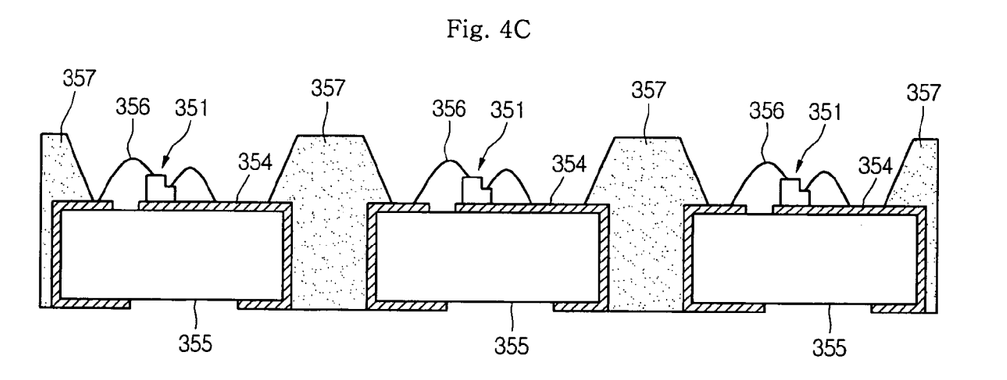

Referring to FIG. 4C, when the wire bonding of the light emitting chips 351 is completed, walls 357 having a predetermined height are formed around edges of the insulation board 355.

The walls 357 serving as the mold are extended to enclose the plurality of insulation boards 355 and fix them at a predetermined height and/or in a predetermined direction, preferably at substantially the same height and in substantially the same direction. The walls 357 are formed as a single mold frame by hardening mold material and fix the insulation boards 355, on which the light emitting chips 351 are mounted, preferably at substantially the same height. At this point, reflective layers may be formed on the inner surfaces of the walls 357, the insulation boards 355 where the light emitting chips 351 are mounted, and the lead frames 354.

Figure 4D:
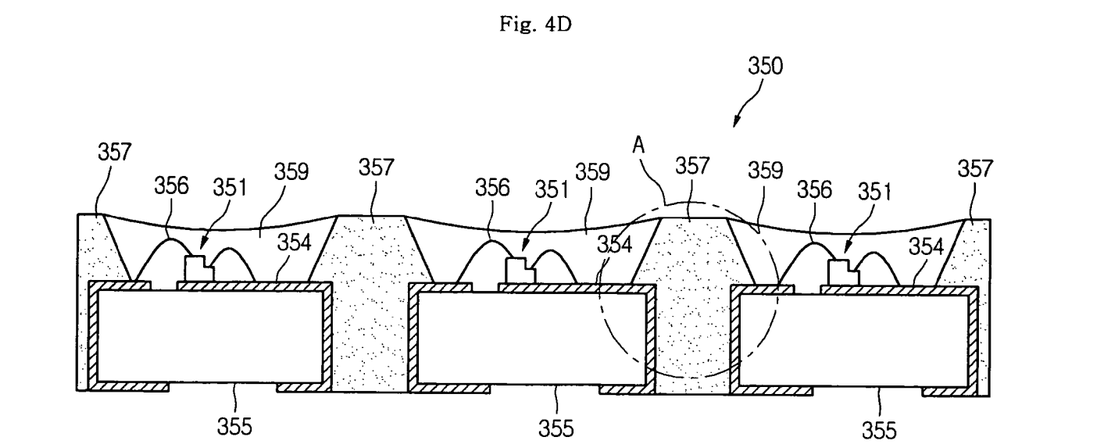

Referring to FIG. 4D, phosphor is injected into the plurality of light emitting chips 351. Then, epoxy 359 is injected on the phosphor. In this manner, a package of one LED array 350 is completed.

Also, the mixture of the phosphor and the epoxy 359 may be molded on the light emitting chips 351.

It will be noted that the applications of the present light emitting diode array are not limited to LCD technology. In fact, the present light emitting diode array may be used in other applications and devices requiring light at predetermined heights and/or directions. For instance, the present light emitting diode may be used in a device requiring a predetermined direction of light emission, such as a uniform direction of light emission.

In the method of the present invention, the plurality of light emitting chips 351 can be aligned at a predetermined height and/or in a predetermined direction by fixing the plurality of light emitting chips 351 with a mold (which thus forms walls) 357.

In the backlight assembly of the present invention, the LED array formed in a package type where the plurality of light emitting chips 351 are fixed using a mold (wall) 357 is mounted on the PCB and thus the LED array can be correctly aligned with the light guide plate.

Therefore, uniform light irradiation of the LED arrays 150, 250 and 350 can prevent non-uniform brightness and light leakage, thereby improving the optical efficiency.

In an alternative embodiment, the fixing member, for instance, the mold, may be prepared in advance. Within the fixing member, a series of cavities are provided. Into each cavity is placed a light emitting chip. The cavities are formed so as to be able to position the inserted light emitting chip at predetermined heights and/or in predetermined directions.

Figure 5:
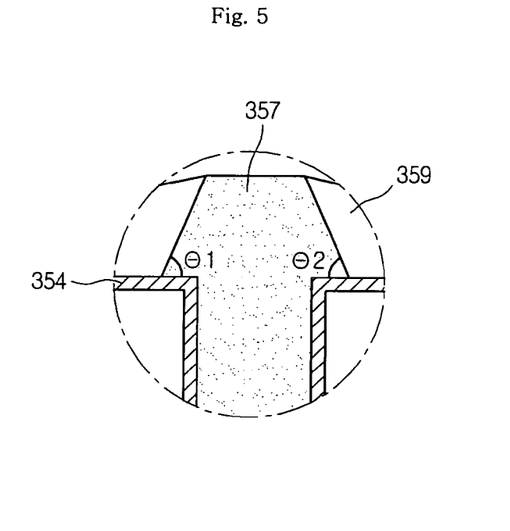
FIG. 5 is an enlarged view of a region A of FIG. 4D.

FIG. 5 is an enlarged view of a region A of FIG. 4D. Referring to FIG. 5, the emission direction of the light from the light emitting chip can be variously adjusted by forming the mold 357 in various structures.

That is, the light from the light emitting chip can be directed in various directions by changing angles $\theta_1$ and $\theta_2$ formed between the inclined surface of the mold 357 and the horizontal surface of the lead frame 354.

By adjusting the light emission direction of the light emitting chip, the darkness or brightness failure occurring in the light guide plate region of the backlight assembly can be solved.

In further detail, if the angle $\theta_1$ of the mold 357 increases and the angle $\theta_2$ of the mold 357 decreases, the light emitting chip disposed in the right region (the $\theta_2$ region) can emit a larger amount of light in a direction of the left region (the $\theta_1$ region). On the contrary, if the angle $\theta_1$ of the mold 357 decreases and the angle $\theta_2$ of the mold 357 increases, the light emitting chip disposed in the left region can emit a larger amount of light in a direction of the right region.

Therefore, even if darker or brighter regions than other regions among the light incidence regions of the light guide plate occur, uniform brightness characteristics can be obtained by adjusting the light emission direction through the above-described modification of the mold 357.

Since the LED array includes a plurality of light emitting chips that are integrally formed by a fixing member, for instance, a mold, it is possible to prevent light leakage and non-uniform brightness, which are caused when individual light emitting chips are aligned on the PCB or the FPC. In addition, since light leakage and non-uniform brightness are prevented, the optical efficiency of the backlight assembly can be improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A light emitting diode array comprising:
    a plurality of light emitting chips spaced apart from one another by predetermined distances;
    at least one mold enclosing the plurality of light emitting chips; and
    a plurality of emitting portions formed on a surface of the at least one mold corresponding to the plurality of light emitting chips,
    wherein said at least one mold positions the light emitting chips at predetermined heights and/or predetermined directions,
    wherein the at least one mold is inclined on an inner surface of the at least one mold.

2. The light emitting diode array according to claim 1, wherein the light emitting chips are positioned at substantially the same height and in substantially the same direction.

3. The light emitting diode array according to claim 1, wherein said at least one mold comprises walls formed around a periphery of the light emitting chips.

4. The light emitting diode array according to claim 1, wherein each of the light emitting chips comprise:
    an insulation board;
    a lead frame formed on the insulation board; and
    a light emitting diode mounted on the lead frame.

5. The light emitting diode array according to claim 4, wherein the walls are molded around the insulation board, whereby the light emitting chips are fixed at predetermined heights and/or predetermined directions.

6. The light emitting diode array according to claim 4, wherein the light emitting diode is a red, green, blue, or white light emitting diode.

7. The light emitting diode array according to claim 4, wherein the light emitting diode is mounted on the lead frame by wire bonding or flip chip bonding.

8. The light emitting diode array according to claim 4, wherein the insulation board is formed of a polymer material or a ceramic.

9. The light emitting diode array according to claim 1, wherein phosphor and epoxy resin are formed on the light emitting chip.

10. The light emitting diode array according to claim 4, further comprising a reflective layer on the lead frames and inner surfaces of the walls.

11. The light emitting diode array according to claim 1, wherein the light emitting chips are positioned at the same height and in the same direction.

12. A method of fabricating a light emitting diode array, comprising:
    providing a plurality of light emitting chips;
    forming at least one mold enclosing the plurality of light emitting chips; and
    forming a plurality of emitting portions on a surface of the at least one mold corresponding to the plurality of light emitting chips,
    wherein the light emitting chips are fixed at predetermined intervals,
    wherein the at least one mold is inclined on an inner surface of the at least one mold.

13. The method according to claim 12, wherein the at least one mold, is formed such that walls are formed around a periphery of the light emitting chips.

14. The method according to claim 12, wherein each light emitting chip comprises an insulation board, a lead frame formed on the insulation board, and a light emitting diode mounted on the lead frame.

15. The method according to claim 14, wherein the mold is molded around the insulation board, whereby the light emitting chips are fixed at predetermined heights and/or predetermined directions.

16. The method according to claim 14, wherein the light emitting diodes are one of red, green, blue and white light emitting diodes.

17. The method according to claim 14, wherein the light emitting diodes are mounted on the lead frames by wire bonding or flip chip bonding.

18. The method according to claim 14, wherein the insulation boards are formed of a polymer material or a ceramic.

19. The method according to claim 14, wherein phosphor and epoxy resin are formed on the light emitting diodes.

20. The method according to claim 13, wherein forming the at least one mold further comprises forming a reflective layer on inner surfaces of the walls formed to enclose the light emitting diodes and the lead frames where the light emitting diodes are mounted.

21. The method according to claim 12, wherein the light emitting chips are fixed at substantially the same height and/or in substantially the same direction.

22. The method according to claim 12, wherein the light emitting chips are formed at the same height and in the same direction.

23. A method of fabricating a light emitting diode array, comprising:
  forming at least one mold having cavities formed therein at predetermined intervals;
  inserting each of a plurality of light emitting chips into each cavity; and
  forming a plurality of output portions on a surface of the at least one mold corresponding to the plurality of light emitting chips,
  wherein the at least one mold is inclined on an inner surface of the at least one mold.

24. The method according to claim 23, wherein each light emitting chip comprises an insulation board, a lead frame formed on the insulation board, and a light emitting diode mounted on the lead frame.

25. The method according to claim 23, wherein the cavities are formed such that the light emitting chips, when inserted, are positioned at predetermined heights and/or in predetermined directions.

26. The method according to claim 23, wherein the cavities are formed such that the light emitting chips, when inserted, are positioned at the same height and in the same direction.

27. A backlight assembly comprising:
  a light emitting diode array comprising:
    a plurality of light emitting chips spaced apart from one another by predetermined distances,
    at least one mold enclosing the plurality of light emitting chips;
    a plurality of emitting portions formed on a surface of said at least one mold corresponding to the plurality of light emitting chips,
    wherein said at least one mold positions the light emitting chips at predetermined heights and/or predetermined directions; and
  a circuit board that applies an electric signal to the light emitting diode array,
  wherein the at least one mold is inclined on an inner surface of the at least one mold.

28. The backlight assembly according to claim 27, further comprising: a light guide plate to receive light from the light emitting diode array and generate surface light.

29. The backlight assembly according to claim 27, wherein the at least one fixing member is at least one mold, which at least one mold is formed such that walls are formed around a periphery of the light emitting chips.

30. The backlight assembly according to claim 29, wherein each light emitting chip comprises:
  an insulation board;
  a lead frame formed on the insulation board; and
  a light emitting diode mounted on the lead frame.

31. The backlight assembly according to claim 30, wherein the mold is molded on both edges of the insulation board where the light emitting diode is mounted, whereby the light emitting chips are fixed.

32. The backlight assembly according to claim 30, wherein the light emitting diodes are one of red, green, blue and white light emitting diodes.

33. The backlight assembly according to claim 30, wherein the light emitting diode is mounted on the lead frame by wire bonding or flip chip bonding.

34. The backlight assembly according to claim 30, wherein the insulation board is formed of a polymer material or ceramic.

35. The backlight assembly according to claim 27, wherein phosphor and epoxy resin are formed on the light emitting chips.

36. The backlight assembly according to claim 30, further comprising a reflective layer on the lead frames and inner surfaces of the walls.

37. The backlight assembly according to claim 27, wherein the light emitting chips are formed at the substantially the same height and/or in substantially the same direction.

38. The backlight assembly according to claim 27, wherein the light emitting chips are formed at the same height and in the same direction.

39. A backlight assembly comprising:
  a plurality of light emitting diode arrays each comprising:
    a plurality of light emitting chips spaced apart from one another by a predetermined distance, and
    at least one mold enclosing the plurality of light emitting chips,
    wherein said at least one mold positions the light emitting chips at predetermined heights and/or predetermined directions;
  a plurality of circuit boards respectively mounted on the light emitting diode arrays that apply electric signals to the light emitting diode arrays; and
  a plurality of emitting portions formed on a surface of the at least one mold corresponding to the plurality of light emitting chips,
  wherein the at least one mold is inclined on an inner surface of the at least one mold.

40. The backlight assembly according to claim 39, further comprising:
  a light diffuser disposed above the light emitting diode arrays.

41. A liquid crystal display device comprising:
  a light emitting diode array comprising:
    a plurality of light emitting chips spaced apart from one another by a predetermined distance, and
    at least one mold enclosing the plurality of light emitting chips,
    wherein said at least one mold positions the light emitting chips at predetermined heights and/or predetermined directions;

a plurality of emitting portions formed on a surface of the at least one mold corresponding to the plurality of light emitting chips;
a circuit board that applies an electric signal to the light emitting diode array;
a light guide plate to receive light from the light emitting diode array and generate surface light; and
a liquid crystal panel disposed above the light guide plate,
wherein the at least one mold is inclined on an inner surface of the at least one mold.

42. A liquid crystal display device comprising:
a plurality of light emitting diode arrays each comprising:
   a plurality of light emitting chips spaced apart from one another by a predetermined distance, and
   at least one mold enclosing the plurality of light emitting chips,
   wherein said at least one mold positions the light emitting chips at predetermined heights and/or predetermined directions;
a plurality of emitting portions formed on a surface of the at least one mold corresponding to the plurality of light emitting chips;
a plurality of circuit boards respectively mounted on the light emitting diode arrays that apply electric signals to the light emitting diode arrays;
a light diffuser disposed above the light emitting diode arrays; and
a liquid crystal panel disposed above the light diffuser,
wherein the at least one mold is inclined on an inner surface of the at least one mold.

* * * * *